US008971101B2

(12) United States Patent
Matsui

(10) Patent No.: US 8,971,101 B2
(45) Date of Patent: Mar. 3, 2015

(54) MAGNETIC MEMORY CELL STRUCTURE WITH IMPROVED READ MARGIN

(75) Inventor: Masaru Matsui, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 417 days.

(21) Appl. No.: 13/558,583

(22) Filed: Jul. 26, 2012

(65) Prior Publication Data

US 2013/0028015 A1 Jan. 31, 2013

(30) Foreign Application Priority Data

Jul. 26, 2011 (JP) ................................. 2011-163167

(51) Int. Cl.
*G11C 11/00* (2006.01)
*G11C 11/16* (2006.01)
(52) U.S. Cl.
CPC ........... *G11C 11/161* (2013.01); *Y10S 977/933* (2013.01); *Y10S 977/935* (2013.01)
USPC ........... 365/158; 365/148; 365/171; 977/933; 977/935
(58) Field of Classification Search
USPC ......... 365/48, 55, 62, 66, 74, 78, 80–93, 100, 365/130, 131, 148, 158, 171–173, 209, 213, 365/225.5, 230.07, 232, 243.5; 257/421, 257/E21.665; 438/3; 977/933–935
See application file for complete search history.

(56) References Cited

U.S. PATENT DOCUMENTS

| | | | |
|---|---|---|---|
| 2004/0008556 A1 | 1/2004 | Hidaka | |
| 2004/0233763 A1* | 11/2004 | Hosotani et al. | ............... 365/222 |
| 2006/0139991 A1 | 6/2006 | Aoki | |
| 2006/0203538 A1* | 9/2006 | Koga | ............................. 365/158 |
| 2008/0037185 A1 | 2/2008 | Tagami et al. | |
| 2009/0154231 A1* | 6/2009 | Katou | ............................ 365/173 |
| 2011/0002163 A1* | 1/2011 | Fukami et al. | ................ 365/173 |

FOREIGN PATENT DOCUMENTS

| | | |
|---|---|---|
| JP | 2004-046962 A | 2/2004 |
| JP | 2004-103212 A | 4/2004 |
| JP | 2006-185477 A | 7/2006 |
| JP | 2007-004969 A | 1/2007 |
| JP | 2008-047669 A | 2/2008 |

OTHER PUBLICATIONS

S. Fukami, et al., "Low-Current Perpendicular Domain Wall Motion Cell for Scalable High-Speed MRAM", Symposium on VLSI Technology Digest of Technical Papers, 2009, 12A-2, pp. 230-231.

* cited by examiner

*Primary Examiner* — Harry W Byrne
(74) *Attorney, Agent, or Firm* — Sughrue Mion, PLLC

(57) ABSTRACT

A semiconductor device includes a memory cell. The cell includes: a magnetic recording layer (MRL) formed of ferromagnetic material; first and second magnetization fixed layers (MFLs) coupled to the MRL; first and second reference layers (RLs) opposed to the MRL; and first and second tunnel barrier films (TBFs) inserted between the MRL and the first and second reference layers (RLs), respectively. The first MFL has a magnetization fixed in a first direction, and the second MFL has a magnetization fixed in a second direction opposite to the first direction. The first and second RLs and the first and second TBFs are positioned between the first and second MFLs. The first RL has a magnetization fixed in a third direction which is selected from the first and second directions, and the second RL has a magnetization fixed in a fourth direction opposite to the third direction.

8 Claims, 18 Drawing Sheets

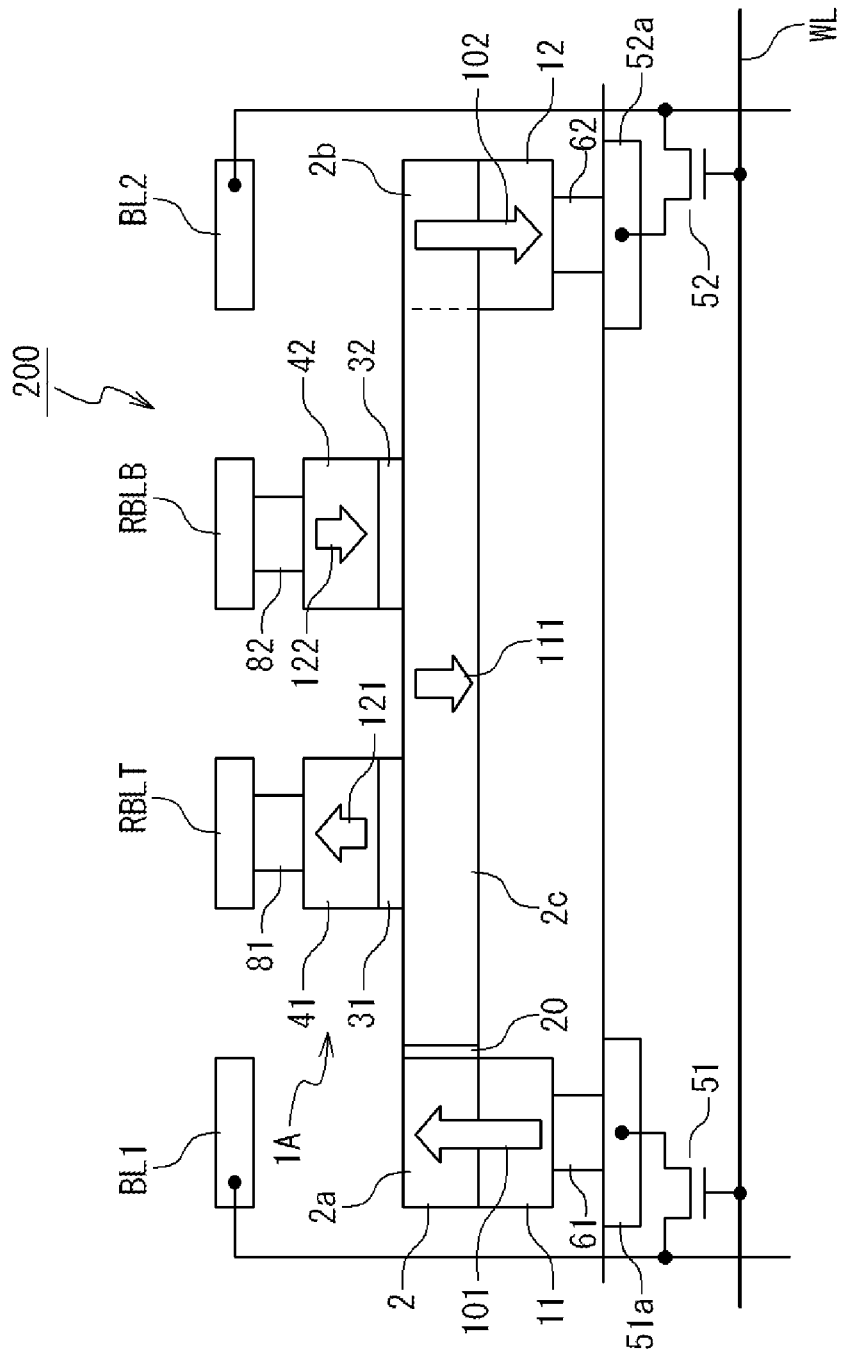

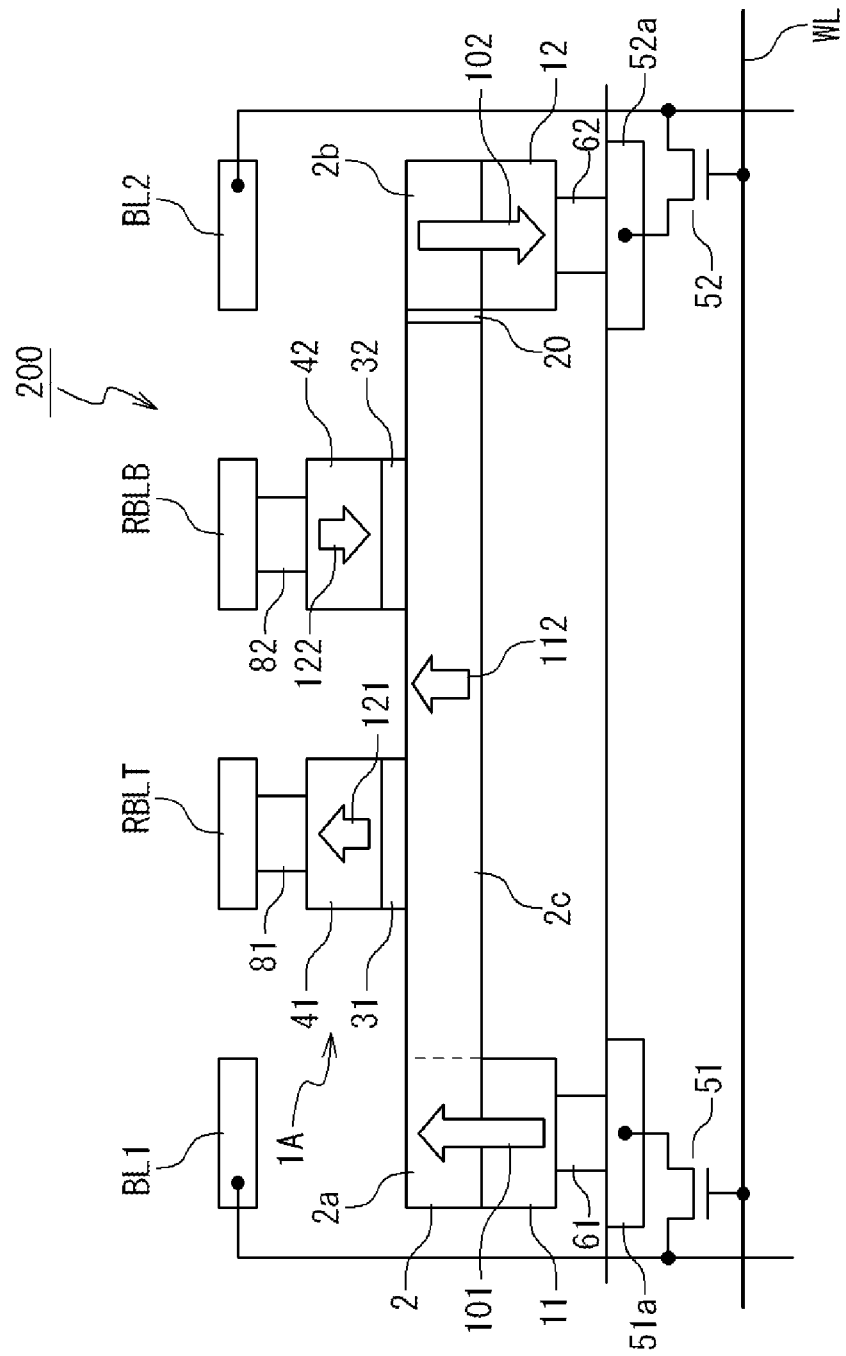

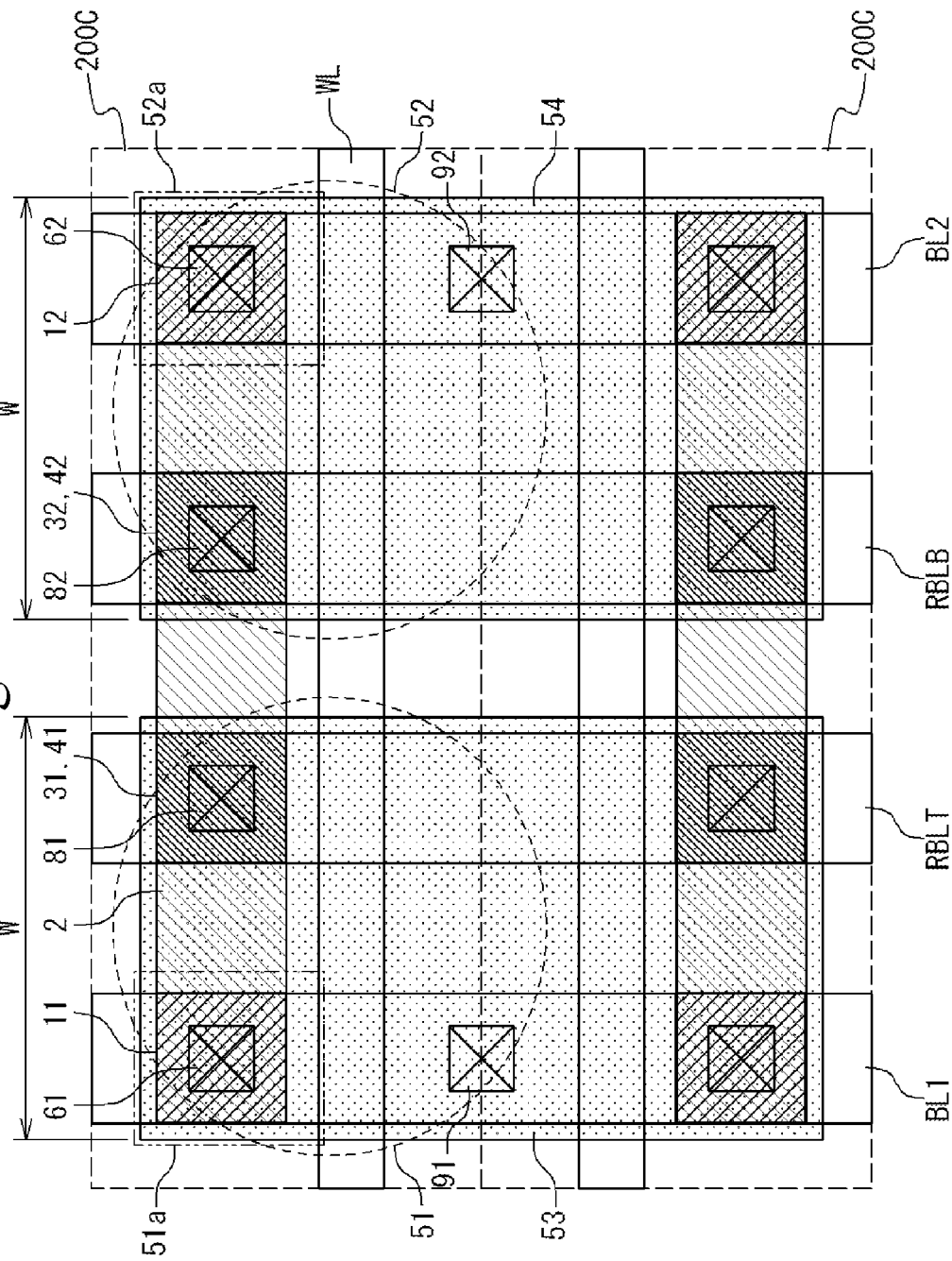

MAGNETIC MEMORY CELL STRUCTURE WITH IMPROVED READ MARGIN

INCORPORATION BY REFERENCE

This application claims the benefit of priority based on Japanese Patent Application No. 2011-163167, filed on Jul. 26, 2011, the disclosure of which is incorporated herein by reference.

BACKGROUND

The present invention relates to semiconductor devices and magnetic random access memories (MRAMs), more particularly, to magnetic memory cells of the magnetic domain wall motion type.

Recently, the MRAM, which uses magnetoresistance effect elements as memory cells, has been proposed as one of non-volatile memories, which are a sort of semiconductor devices. Especially, magnetoresistance effect elements having a magnetic tunnel junction (which may be referred to as "MTJ", hereinafter) are often used as MRAM memory cells due to the advantage of a very large magnetoresistance effect. The magnetic tunnel junction has a laminated structure in which a non-magnetic dielectric film (hereinafter, referred to as tunnel barrier film) is disposed between two ferromagnetic films. Data are stored as the relative direction of the magnetizations of the two ferromagnetic films. For example, the state in which the magnetizations are directed in parallel is correlated with data "0" and the state in which the magnetizations are directed in antiparallel is correlated with data "1". The electric resistance for a current flowing in the perpendicular direction to the film surface of the laminated structure varies depending on the relative angle of the magnetizations of the two ferromagnetic films. The electric resistance of the magnetic tunnel junction takes the minimum value when the magnetizations are directed in parallel, and takes the maximum value when the magnetizations are directed in antiparallel. The data read is achieved by using the changes in the electric resistance. The MRAM attracts a lot of attention in the field of embedded memories, and there is a demand for the high-speed random access of the MRAM as replacements of SRAMs (static random access memory) and DRAMs (dynamic random access memory).

Various MRAMs are known in the art and one type of the MRAM is the magnetic domain wall motion type. The magnetic domain wall motion type MRAM achieves data writing by moving the magnetic domain wall through the spin transfer effect of spin-polarized electrons with a write current flowing in the in-plane direction of a ferromagnetic film and thereby directing the magnetization of the ferromagnetic film in the direction depending on the direction of the write current. Such a magnetic domain wall motion type MRAM is disclosed in 2009 Symposium on VLSI Technology Digest of Technical Papers 12A-2.

FIG. 1A is a diagram schematically showing the structure of a memory cell 300 of the magnetic domain wall motion type MRAM disclosed in this document. The memory cell shown in FIG. 1A includes a magnetoresistance effect element 1 and NMOS transistors 51 and 52. The magnetoresistance effect element 1 includes: magnetization fixed layers 11, 12; a magnetic recording layer 2 disposed on the magnetization fixed layers 11, 12; a reference layer 4; and a tunnel barrier layer 3 disposed between the magnetic recording layer 2 and the reference layer 4. The magnetization fixed layers 11, 12 and the reference layer 4 are each formed of a ferromagnetic film having a fixed magnetization. The magnetic recording layer 2 is also formed of a ferromagnetic film. The magnetizations of regions 2a and 2b of the magnetic recording layer 2, which are coupled with the magnetization fixed layers 11 and 12, respectively, are fixed by the exchange coupling with the magnetization fixed layers 11 and 12. Hereinafter, the regions 2a and 2b may be referred to as magnetization fixed regions 2a and 2b, respectively. The region 2c between the magnetization fixed regions 2a and 2b has a reversible magnetization. Hereinafter, the region 2c may be referred to as magnetization reversible region 2c. The reference layer 4, the tunnel barrier layer 3 and the magnetization reversible region 2c form an MTJ.

The NMOS transistor 51 has a drain connected to the magnetization fixed layer 11 and a source connected to a write bitline BL1. The NMOS transistor 52 has a drain connected to the magnetization fixed layer 12 and a source connected to a write bitline BL2. The gates of the NMOS transistors 51 and 52 are commonly connected to the word line WL. In the structure shown in FIG. 1A, the reference layer 4 is connected to the grounding line GND. In FIG. 1A, the arrows 101, 102, 110 and 120 indicate the directions of the magnetizations of the respective layers.

FIG. 2A is a cross section view showing an example of the cross section structure of the memory cell 300 shown in FIG. 1A and FIG. 3A is a plan view showing an example of the layout of the memory cell 300. FIG. 2A schematically shows the NMOS transistors 51 and 52, because the diffusion layers of the NMOS transistors 51 and 52 are actually disposed to extend in the direction parallel to the write bitlines BL1 and BL2.

As shown in FIG. 2A, the tunnel barrier film 3 and the reference layer 4 are sequentially laminated on the magnetic recording layer 2 to form an MTJ. The magnetization fixed layers 11 and 12 are disposed in contact with the bottom surface of the magnetic recording layer 2 near both ends of the magnetic recording layer 2. The reference layer 4 is connected to a grounding line GND via a via-contact 8. The drain 51a of the NMOS transistor 51 is connected to the magnetization fixed layer 11 via a via-contact 61, and the drain 52a of the NMOS transistor 52 is connected to the magnetization fixed layer 12 via a via-contact 62. The grounding line GND is formed of a metal interconnection located in a first interconnection layer. The bitlines BL1 and BL2 are, on the other hand, formed of a metal interconnection located in a second interconnection layer which is positioned above the first interconnection layer.

As shown in FIG. 3A, each word line WL is provided in the form of a polysilicon gate and disposed to intersect diffusion layers 53 and 54. Each NMOS transistor 51 is formed by a word line WL and a diffusion layer 53, and each NMOS transistor 52 is formed by a word line WL and a diffusion layer 54. The sources of the NMOS transistors 51 and 52 are connected to the write bitlines BL1 and BL2 via via-contacts 63 and 64. The reference layer 4 is connected to the grounding line GND via the via-contact 8. The grounding lines GND are disposed in parallel to the word line WLs.

The data writing into the memory cell 300 shown in FIGS. 1A to 3A is achieved by generating a write current flowing between the write bitlines BL1 and BL2 with the NMOS transistors 51 and 52 turned on, and thereby switching the magnetization direction 110 of the magnetization reversible region 2c of the magnetic recording layer 2. The data reading is, on the other hand, achieved by generating a read current flowing from the write bitline BL1 (or BL2) to the grounding line GND via the MTJ of the magnetoresistance effect element 1 and comparing the read current with a reference current by a sense amplifier (not shown). The ground line GND is shared over the memory array.

Although FIGS. 1A to 3A shows that the reference layer 4 is connected to the grounding line GND in the memory cell 300, the reference layer 4 may be connected to a read bitline RBL, which is individually provided for each column, in place of the grounding line GND. FIGS. 1B to 3B show such a structure in which the reference layer 4 is connected to a read bitline RBL. In detail, FIG. 1B schematically shows the structure of the memory cell 300 in which the reference layer 4 is connected to the read bitline RBL, and FIG. 2B is a cross section view showing an example of the cross section structure of the MRAM cell shown in FIG. 1B. FIG. 3B is a layout diagram showing an example of the layout of the MRAM cell shown in FIG. 1B. The high-speed read from an MRAM memory cell requires reduction in the capacitance of the interconnection used for data read, and the structure shown in FIGS. 1B to 3B, in which a read bitline RBL is provided for each column, is suitable for the high-speed operation. As shown in FIGS. 2B and 3B, the read bitlines RBL are disposed in parallel to the write bitlines BL1 and BL2. In the structure shown in FIG. 2B, in which the read bitlines RBL do not intersect with the write bitlines BL1 and BL2, the read bitlines RBL are formed of a metal interconnection located in the first interconnection layer. Except for this point, the memory cell 300 shown in FIGS. 1B to 3B has the same structure as that shown in FIGS. 1A to 3A.

FIG. 4 is a block diagram showing one example of the structure of an MRAM which incorporates memory cells 300 shown in FIGS. 1B to 3B. The MRAM shown in FIG. 4 includes a memory cell array in which memory cells 300 structured as described above are arranged in rows and columns. The memory cell array further includes word lines WL, write bitlines BL1, BL2 and read bitlines RBL.

The MRAM further includes an X selector 301, a write Y selector 302, a write current supply circuit 303, a read Y selector 304, a read current load circuit 305, a sense amplifier 306, an output circuit 307 and a reference current circuit 308. The X selector 301 is connected to the word lines WL, and selects the word line WL connected to the selected memory cell (the memory cell 300 to be accessed) in the write operation and read operation. In FIG. 4, the selected memory cell is denoted by the numeral 300s and the selected word line is denoted by the numeral WLs.

The write Y selector 302 is connected to the write bitlines BL1 and BL2, and selects the write bitlines BL1 and BL2 connected to the selected memory cell 300s as the selected write bitlines BL1s and BL2s. The write current supply circuit 303 generates a write current to be fed to the selected memory cell 300s in response to data inputted to the inputs of the write current supply circuit 303.

The read Y selector 304 is connected to the read bitlines RBL. The read Y selector 304 selects the read bitline RBL connected to the selected memory cell 300s as the selected read bitline RBLs. The read current load circuit 305 applies a predetermined voltage to the selected read bitline RBLs. The reference current circuit 308 includes a constant current circuit or reference cells which have the same structure as the memory cells. The sense amplifier 306 compares the read current flowing through the selected read bitline RBLs with a reference current supplied from the reference current circuit 308 to identify data stored in the selected memory cell 300s. The output circuit 307 outputs the data identified by the sense amplifier 306.

The above-described MRAM suffers from a problem of reduction in the read margin caused by the variability in the MR ratio of the MTJ on the manufacturing processes. In the above-described MRAM, the read current flowing through the MTJ of the selected memory cell 300s is compared with the reference current $i_{REF}$ to identify the data stored in the selected memory cell 300s. The ratio of the read current $i_H$ of the selected memory cell 300s for the MTJ in the high-resistance state to the read current $i_L$ for the MTJ in the low-resistance state depends on the MR ratio of the MTJ. FIG. 5 is a graph showing an exemplary waveform of the read current. The sense amplifier 306 identifies the data by using the differential current $\Delta H$ having the current level of the difference between the read current $i_H$ and the reference current $i_{REF}$ or the differential current $\Delta L$ having the current level of the difference between the read current $i_L$ and the reference current $i_{REF}$. According to a reference in the art, a typical MR ratio of an MTJ is 44%. In this case, the ratio of the read currents $i_L$ and $i_H$ is represented by expression (1):

$$i_L:i_H \approx 1.44:1. \tag{1}$$

In general, the reference current $i_{REF}$ is generated so as to have the average value of the read current $i_H$ for the high-resistance state and the read current $i_L$ for the low-resistance state. The reference current $i_{REF}$ normalized by the read current $i_H$ for the high-resistance state is represented by expression (2):

$$i_{REF} = (1.44+1)/2 \approx 1.22. \tag{2}$$

Accordingly, the ratio of the read current $i_H$ for the high-resistance state to the reference current $i_{REF}$ is represented by expression (3) and the ratio of the reference current $i_{REF}$ to the read current $i_L$ for the low-resistance state is represented by expression (4):

$$i_H:i_{REF} = 1:1.22 \approx 0.82:1, \text{ and} \tag{3}$$

$$i_{REF}:i_L = 1.22:1.44 \approx 1:1.18. \tag{4}$$

The differential currents $\Delta L$ and $\Delta H$ which are available for the sense amplifier 306 in the events that the MTJ of the selected memory cell 300s is placed in the low-resistance state and the high-resistance state, respectively, can be represented by the following expressions, which are derived from expressions (1) to (4):

$$\Delta L = i_L - i_{REF} = 1.18 \times i_{REF} - i_{REF}, \tag{5}$$
$$= 0.18 \times i_{REF}, \text{ and}$$

$$\Delta H = i_{REF} - i_H = i_{REF} - 0.82 \cdot i_{REF}, \tag{6}$$
$$= 0.18 \times i_{REF}.$$

Expressions (7) and (8) which represent the differential currents $\Delta L$ and $\Delta H$ with the current $i_H$, which is the read current for the high-resistance state, can be obtained from expressions (5) and (6), respectively, as follows:

$$\Delta L = 0.18 \times i_H/0.82 \approx 0.22 \times i_H. \tag{7}$$

$$\Delta H = 0.18 \times i_H/0.82 \approx 0.22 \times i_H. \tag{8}$$

As is understood from expressions (7) and (8), only 22% of the read current $i_H$ is available as the differential currents $\Delta L$ and $\Delta H$, which is fed to the sense amplifier 306, for the MR ratio of 44%. This undesirably reduces the read margin when the MR ratio is decreased due to the variability on the manufacturing processes.

It should be noted that techniques for increasing the read margin are disclosed in Japanese Patent Application Publications Nos. 2008-047669, 2007-004969, 2006-185477, 2004-

103212, and 2004-046962. According to a study of the inventor, however, there is a more advantageous approach as discussed below.

SUMMARY

In one embodiment, a semiconductor device includes a memory cell. The memory cell includes: a magnetic recording layer formed of ferromagnetic material; first and second magnetization fixed layers coupled to the magnetic recording layer; first and second reference layers opposed to the magnetic recording layer; and first and second tunnel barrier films inserted between the magnetic recording layer and the first and second reference layers, respectively. The first magnetization fixed layer has a magnetization fixed in a first direction, and the second magnetization fixed layer has a magnetization fixed in a second direction opposite to the first direction. The first and second reference layers and the first and second tunnel barrier films are positioned between the first and second magnetization fixed layers. The first reference layer has a magnetization fixed in a third direction which is selected from the first and second directions, and the second reference layer has a magnetization fixed in a fourth direction opposite to the third direction.

The data identification of the memory cell can be achieved by generating a first read current flowing through a first MTJ which includes the first reference layer, the first tunnel barrier film and the magnetic recording layer, generating a second read current flowing through a second MTJ which includes the second reference layer, the second tunnel barrier film and the magnetic recording layer, and comparing the first and second read currents.

The above-described embodiment effectively increases the read margin of a magnetic random access memory.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 9A is a diagram showing one of two allowed states of each memory cell in the first embodiment;

FIG. 9B is a diagram showing the other of the two allowed states of each memory cell in the first embodiment;

FIG. 14 is a plan view showing an exemplary layout of a memory cell of a fourth embodiment.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 6:
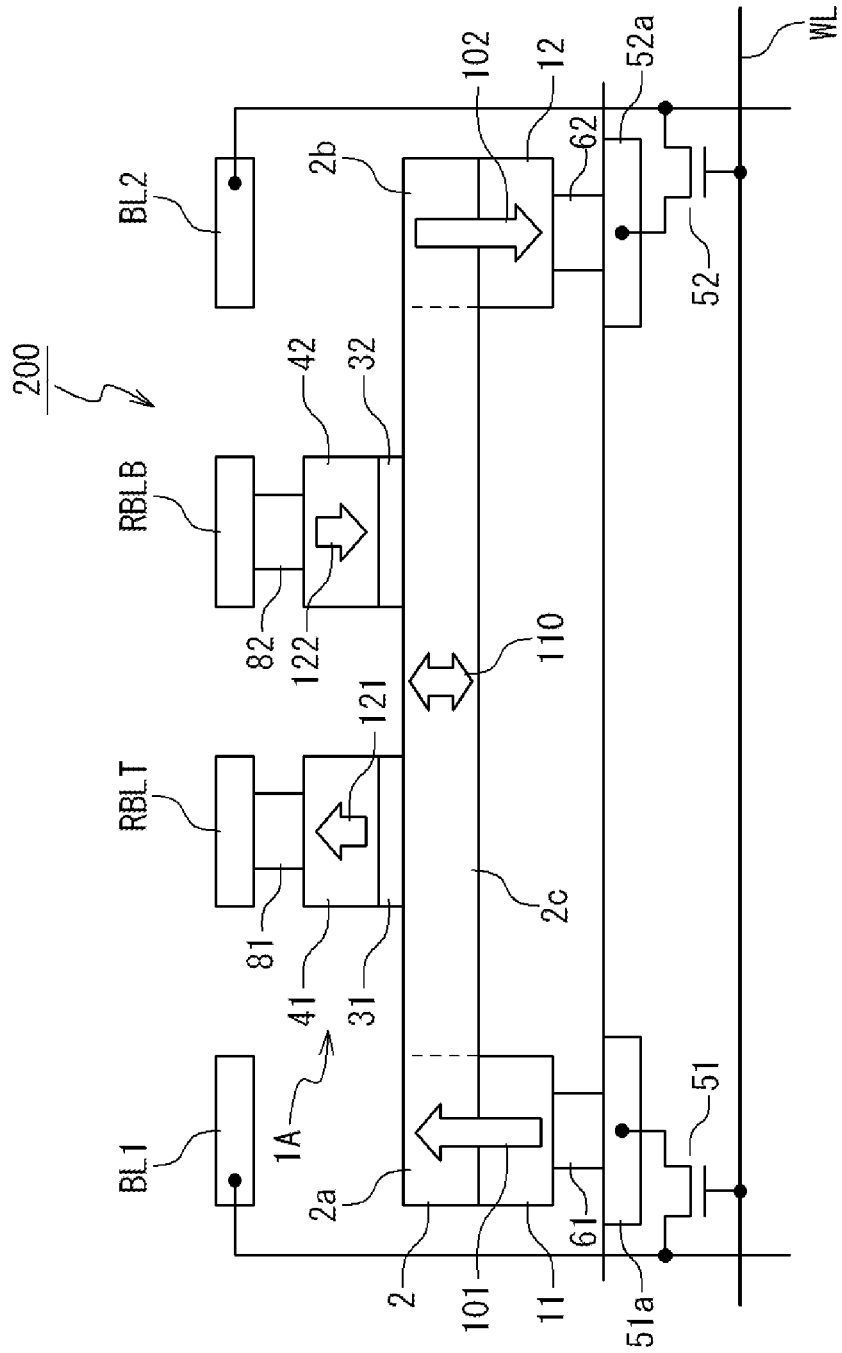
FIG. 6 is a section view showing an exemplary structure of a memory cell of a magnetic random access memory of a first embodiment.
Figure 7:
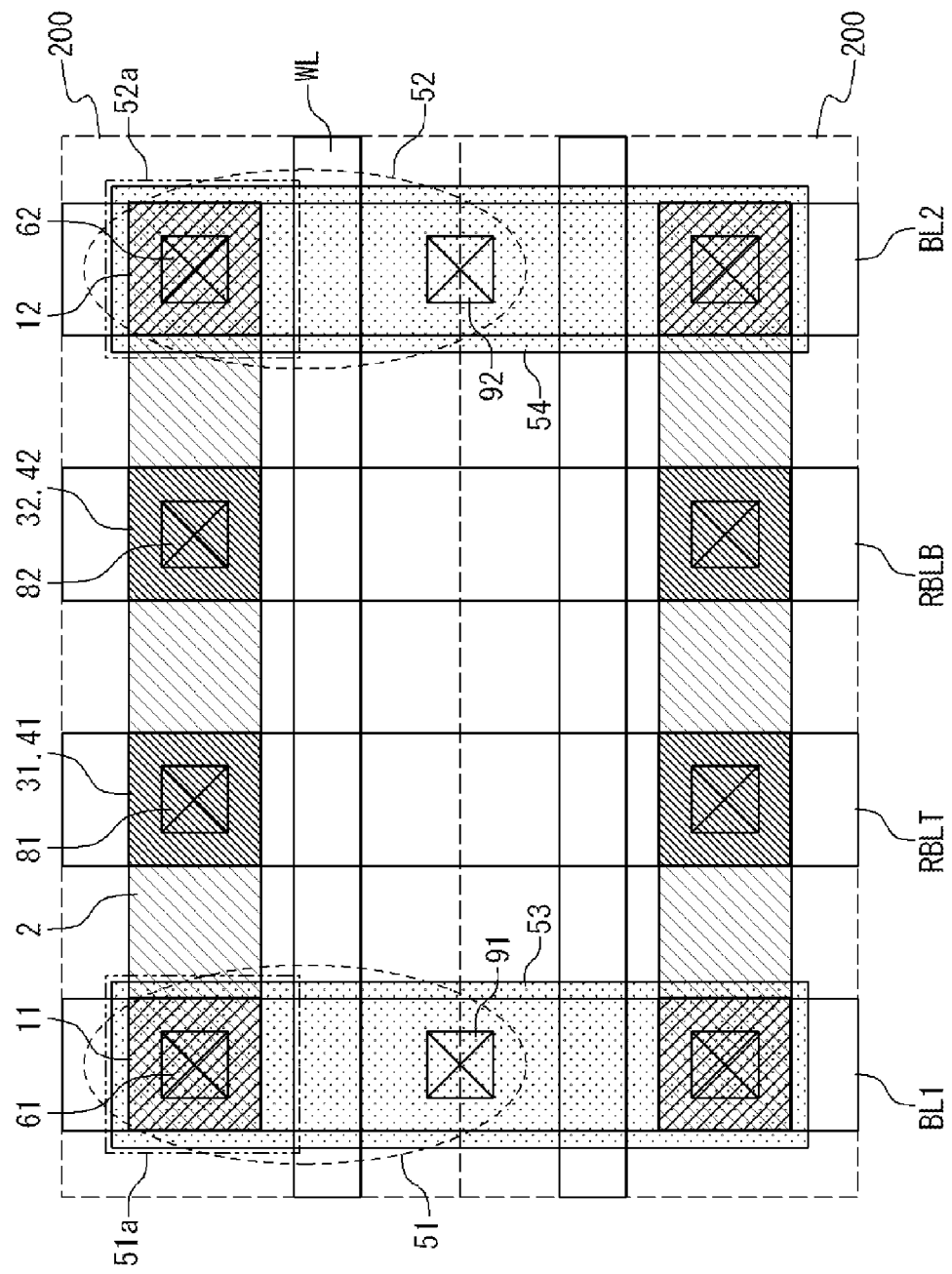
FIG. 7 is a plan view showing the layout of the memory cells in the first embodiment.

FIG. 6 is a section view showing an exemplary structure of a memory cell 200 of a magnetic random access memory of a first embodiment and FIG. 7 is a plan view showing the layout of the memory cell 200. In FIG. 6, the arrows 101, 102, 110, 121 and 122 show the magnetization directions of the respective layers.

As shown in FIG. 6, the memory cell 200 includes a magnetoresistance effect element 1A and NMOS transistors 51 and 52. The NMOS transistors 51 and 52 are switching elements used for the selection of the memory cell 200. The NMOS transistor 51 has a gate connected to a word line WL and a source connected to a write bitline BL1. Similarly, the NMOS transistor 52 has a gate connected to the word line WL and a source connected to a write bitline BL2. The write bitlines BL1 and BL2 are formed in the form of metal interconnections positioned in the first interconnection layer (that is, the lowermost metal interconnection layer). It should be noted that FIG. 6 schematically shows the NMOS transistors 51 and 52, because the diffusion layers of the NMOS transistors 51 and 52 are actually disposed to extend in the direction parallel to the write bitlines BL1 and BL2.

The magnetoresistance effect element 1A includes: magnetization fixed layers 11, 12; a magnetic recording layer 2 formed on the upper faces of the magnetization fixed layers 11 and 12; reference layers 41, 42; and tunnel barrier films 31 and 32 disposed between the magnetic recording layer 2 and the reference layers 41 and 42, respectively.

The magnetization fixed layers 11 and 12 are each formed of a ferromagnetic film having a fixed magnetization. The magnetizations of the magnetization fixed layers 11 and 12 are directed in the opposite directions. In this embodiment, the magnetization of the magnetization fixed layer 11 is fixed in the upward direction and that of the magnetization fixed layer 12 is fixed in the downward direction. The magnetization fixed layer 11 is connected to the drain 51a of the NMOS transistor 51 via a via-contact 61 and the magnetization fixed layer 12 is connected to the drain 52a of the NMOS transistor 52 via a via-contact 62.

The magnetic recording layer 2 is also formed of a ferromagnetic film. Here, the magnetizations of regions 2a and 2b of the magnetic recording layer 2, which are coupled to the magnetization fixed layers 11 and 12, respectively, are fixed by exchange coupling with the magnetization fixed layers 11 and 12. Hereinafter, the regions 2a and 2b may be referred to as magnetization fixed regions 2a and 2b, respectively. The region 2c between the regions 2a and 2b has a reversible magnetization, and therefore the region 2c may be referred to as magnetization reversible region 2c.

The tunnel barrier films 31 and 32 are disposed on the upper face of the magnetic recording layer 2 and the reference layers 41 and 42 are disposed on the upper faces of the tunnel barrier films 31 and 32, respectively. Two MTJs are formed by the reference layers 41, 42, the tunnel barrier films 31, 32 and the magnetization reversible region 2c of the magnetic recording layer 2. The reference layers 41 and 42 have magnetizations directed in the opposite directions. In this embodiment, the magnetization of the reference layer 41 is directed in the upward direction and that of the reference layer 42 is directed in the downward direction. The reference layer 41 is connected to a read bitline RBLT via a via-contact 81 and the reference layer 42 is connected to a read bitline RBLB via a via-contact 82. Both of the read bitlines RBLT and RBLB are formed in the form of metal interconnections positioned in the first interconnection layer (that is, the lowermost metal interconnection layer).

Two memory cells 200 which are mirror-symmetrically arranged are shown in FIG. 7. The read bitlines RBLT, RBLB and the write bitlines BL1 and BL2, which are formed of metal interconnections positioned in the same interconnection layer, are arranged in parallel to one another in accordance with given design rules. The word lines WL are formed in the form of polysilicon gates and disposed to intersect with diffusion layers 53 and 54. The diffusion layers 53, 54 and the word lines WL form the NMOS transistors 51 and 52. The word lines WL are disposed to extend in the perpendicular direction to the direction of the read bitlines RBLT, RBLB and the write bitlines BL1 and BL2. The drain of the NMOS transistor 51 is connected to the magnetization fixed layer 11 via the via-contact 61 and the drain of the NMOS transistor 52 is connected to the magnetization fixed layer 12 via the via-contact 62. Furthermore, the source of the NMOS transistor 51 is connected to the write bitline BL1 via a via-contact 91 and the source of the NMOS transistor 52 is connected to the write bitline BL2 via a via-contact 92. The magnetic recording layer 2 is arranged at certain distances from the cell boundary and the via-contacts 91 and 92, in accordance with the design rules.

Figure 8:
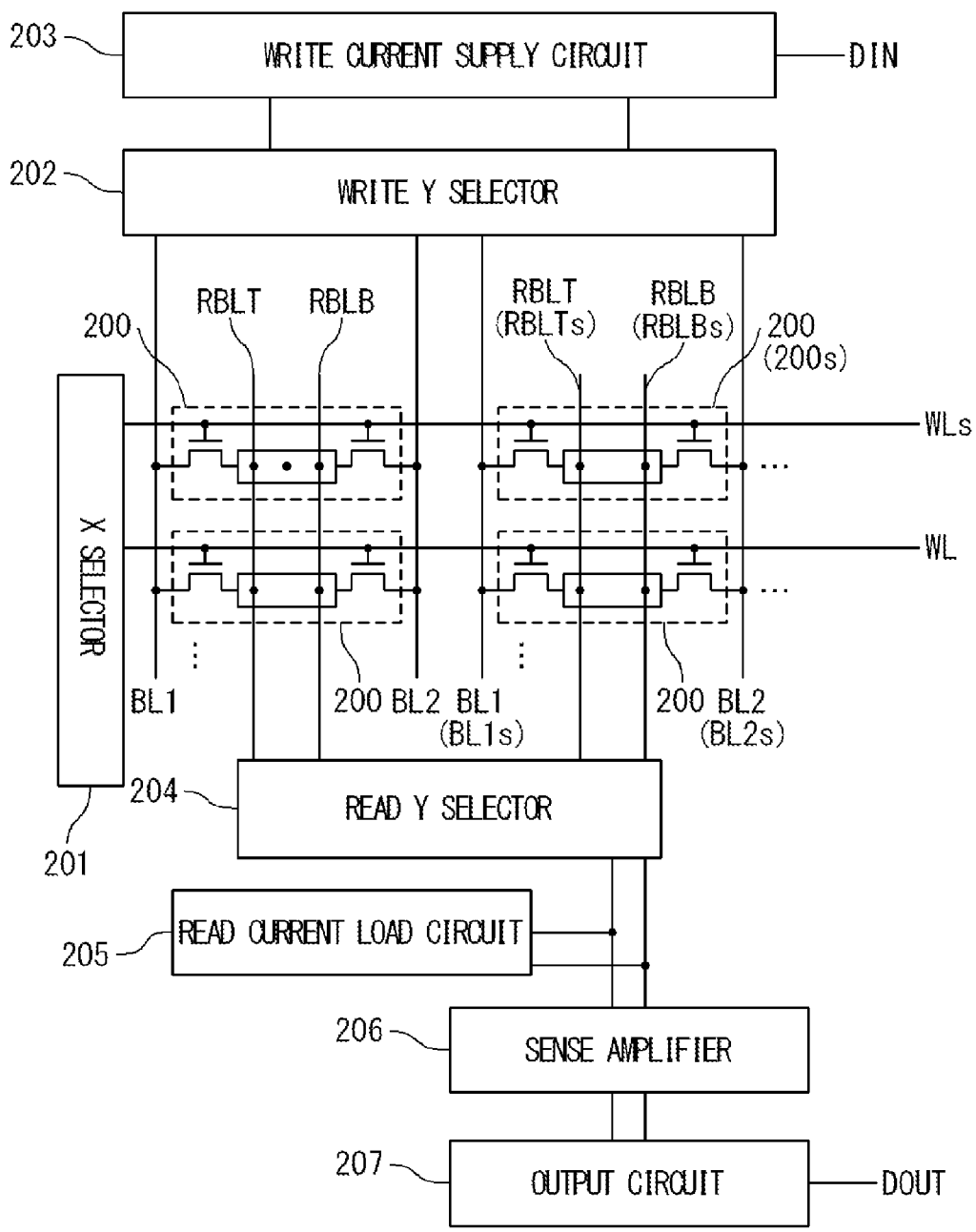
FIG. 8 is a block diagram showing an exemplary configuration of the magnetic random access memory of the first embodiment.

FIG. 8 is a block diagram showing one example of the configuration of the MRAM which incorporates memory cells 200 shown in FIGS. 6 and 7. The MRAM of this embodiment includes a memory cell array in which the memory cells 200 structured as described above are arrayed in rows and columns. The memory cell array further includes word lines WL, write bitlines BL1, BL2 and read bitlines RBLT and RBLB.

The MRAM further includes an X selector 201, a write Y selector 202, a write current supply circuit 203, a read Y selector 204, a read current load circuit 205, a sense amplifier 206 and an output circuit 207. As described later, the reference current is generated by a selected memory cell 200 itself and therefore the MRAM does not include any circuit corresponding to the reference current circuit 308 shown in FIG. 4.

The X selector 201 is connected to the word lines WL and selects the word line WL connected to a selected memory cell (the memory cell 200 to be accessed) as the selected word line in the data write operation and the data read operation. In FIG. 8, the selected memory cell is denoted by the numeral 200s and the selected word line is denoted by the numeral WLs.

The write Y selector 202 is connected to the write bitlines BL1 and BL2 and selects the write bitlines BL1 and BL2 connected to the selected memory cell 200s as the selected write bitlines BL1s and BL2s. The write current supply circuit 203 generates a write current to be fed to the selected memory cell 200s in response to input data DIN inputted to the inputs of the write current supply circuit 203.

The read Y selector 204 is connected to the read bitlines RBLT and RBLB. The read Y selector 204 selects the read bitlines RBLT and RBLB connected to the selected memory cell 200s as the selected read bitlines RBLTs and RBLBs. The read current load circuit 205 applies a predetermined voltage to the selected read bitlines RBLTs and RBLBs. The sense amplifier 206 compares read currents flowing through the two selected read bitlines RBLTs and RBLBs to identify data stored in the selected memory cell 200s. The output circuit 207 outputs the data identified by the sense amplifier 206 as output data DOUT.

Next, a description is given of an exemplary operation of the magnetic random access memory of the first embodiment. In the first embodiment, the magnetizations of the reference layers 41 and 42, which are connected to the read bitlines RBLT and RBLB, respectively, are directed in the opposite directions. The arrows 101, 102, 110, 121 and 122 indicate the magnetization direction of the respective layers. Each memory cell 200 thus structured is configured to generate both of a data current corresponding to stored data and a reference current to be compared with the data current.

There are two allowed states for each memory cell 200, and FIGS. 9A and 9B show the two allowed states. Each memory cell 200 stores data as the position of the magnetic domain wall 20, that is, the magnetization direction of the magnetization reversible region 2c. The following description is given with an assumption that a memory cell 200 stores "0" data when the magnetization reversible region 2c has a magnetization directed in the downward direction and the memory cell stores "1" data when the magnetization reversible region 2c has a magnetization directed in the upward direction.

The data writing is achieved by generating a write current flowing between the write bitlines BL1 and BL2 via the magnetic recording layer 2 with the NMOS transistors 51 and 52 turned on. In detail, when the write current is generated to flow from the write bitline BL1 to the write bitline BL2 via the magnetization fixed layer 2, the magnetic domain wall 20 moves in the magnetic recording layer 2 and reaches a position between the magnetization fixed layer 11 and the reference layer 41 as shown in FIG. 9A. In this case, the magnetization directions of the reference layer 41 and the magnetization reversible region 2c are directed in the opposite directions and the magnetization directions of the reference layer 42 and the magnetization reversible region 2c are directed in the same direction. This results in that the MTJ incorporating the reference layer 41, the tunnel barrier film 31 and the magnetization reversible region 2c is placed into the high-resistance state, and the MTJ incorporating the reference layer 42, the tunnel barrier film 32 and the magnetization reversible region 2c is placed into the low-resistance state.

When the write current is generated to flow from the write bitline BL2 to the write bitline BL1 via the magnetization fixed layer 2, on the other hand, the magnetic domain wall 20 moves in the magnetic recording layer 2 and reaches a position between the magnetization fixed layer 12 and the reference layer 42 as shown in FIG. 9B. In this case, the magnetization directions of the reference layer 41 and the magnetization reversible region 2c are directed in the same direction and the magnetization directions of the reference layer 42 and the magnetization reversible region 2c are directed in the opposite directions. This results in that the MTJ incorporating the reference layer 41, the tunnel barrier film 31 and the magnetization reversible region 2c is placed into the low-resistance state, and the MTJ incorporating the reference layer 42, the tunnel barrier film 32 and the magnetization reversible region 2c is placed into the high-resistance state.

The data reading is achieved by applying a predetermined voltage to the read bitlines RBLT and RBLB to generate read currents flowing through the two MTJs of the selected memory cell 200s. When "0" data are to be read, that is, when the magnetic domain wall 20 is positioned between the reference layer 41 and the magnetization fixed layer 11 as shown in FIG. 9A, the MTJ connected to the read bitline RBLTs is placed in the high-resistance state and the MTJ connected to the read bitline RBLBs is placed in the low-resistance state. When the word line WL is set to the high level to turn on the NMOS transistors 51 and 52 with the write bitlines BL1 and BL2 fixed to the circuit ground level and with the read bitlines RBLTs and RBLBs applied with a predetermined voltage, read currents $i_{RBLT}$ and $i_{RBLB}$ flow through the read bitlines RBLTs and RBLBs, respectively. Since the read current $i_{RBLT}$ flows through the MTJ in the high-resistance state and the read current $i_{RBLB}$ flows through the MTJ in the low-resistance state, the read current $i_{RBLB}$ is larger than the read current $i_{RBLT}$. As is understood from this discussion, the data identification can be achieved by comparing the read currents $i_{RBLT}$ and $i_{RBLB}$ by the sense amplifier 206. In this embodiment, the selected memory cell 200s can be determined as storing "0" data from the fact that the read current $i_{RBLB}$ is larger than the read current $i_{RBLT}$. In this case, the output circuit 207 outputs "0" data in response to the comparison result obtained by the sense amplifier 206.

The data reading of "1" data can be achieved in the same way. The selected memory cell 200s is determined as storing "1" data when the read current $i_{RBLT}$ is larger than the read current $i_{RBLB}$.

Figure 10:
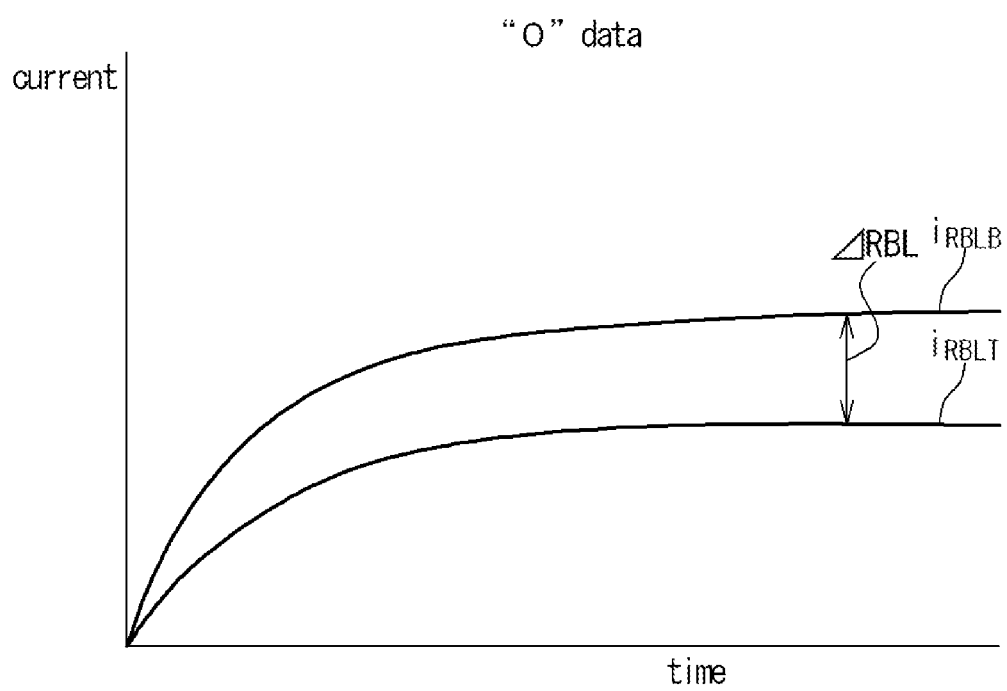
FIG. 10 is a diagram showing a differential current ΔRBL obtained in the magnetic random access memory of the first embodiment.

The data reading described above effectively enlarges the read margin. FIG. 10 is a graph showing the current levels of the read currents in reading "0" data. When "0" data are read from the selected memory cell 200, the read current $i_{RBLT}$ flowing through the read bitline RBLTs is equal to a current flowing through the MTJ in the high-resistance state, and the read current $i_{RBLB}$ flowing through the read bitline RBLBs is equal to a current flowing through the MTJ in the low-resistance state. The ratio of the read currents depends on the MR ratio and the ratio of the read currents $i_{RBLT}$ and $i_{RBLB}$ is 1:1.44 for an MR ratio of 44%, which is a value disclosed in a reference in the art.

Accordingly, the differential current ΔRBL is represented by expression (9):

$$\Delta RBL = i_{RBLB} - i_{RBKT}, \quad (9)$$
$$= 1.44 \times i_{RBLT} - i_{RBLT},$$
$$= 0.44 \times i_{RBLT}.$$

Figure 5:
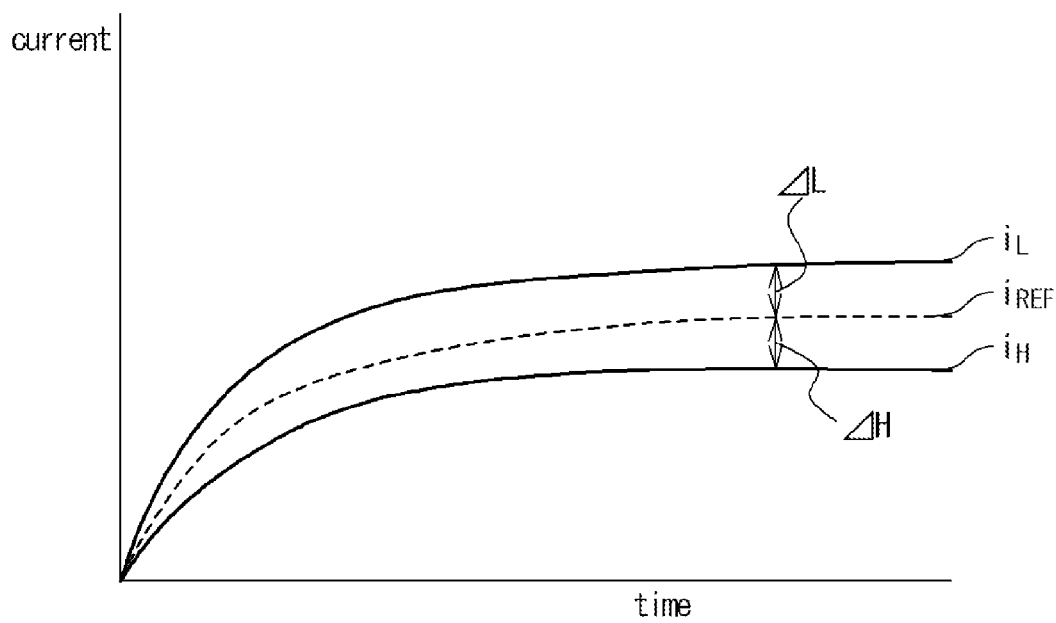
FIG. 5 is a graph showing the differential currents ΔL and ΔH obtained in the magnetic random access memory shown in FIG. 4.

The read current $i_{RBLT}$, which is the current flowing through the MTJ in the high-resistance state, is equal to the read current $i_H$ shown in FIG. 5. Accordingly, the differential current ΔRBL sensed by the sense amplifier 206 in this embodiment can be represented as follows:

$$\Delta RBL = 0.44 \times i_H. \quad (10)$$

Figure 1A:
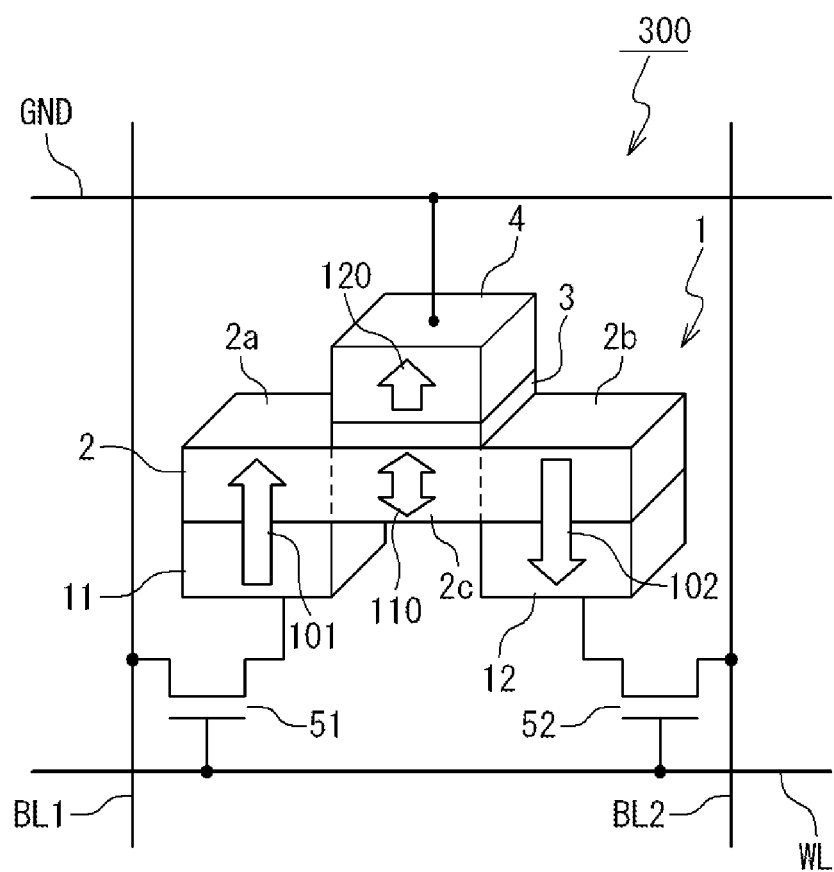
FIG. 1A shows an exemplary structure of a memory cell of a known magnetic random access memory.
Figure 1B:
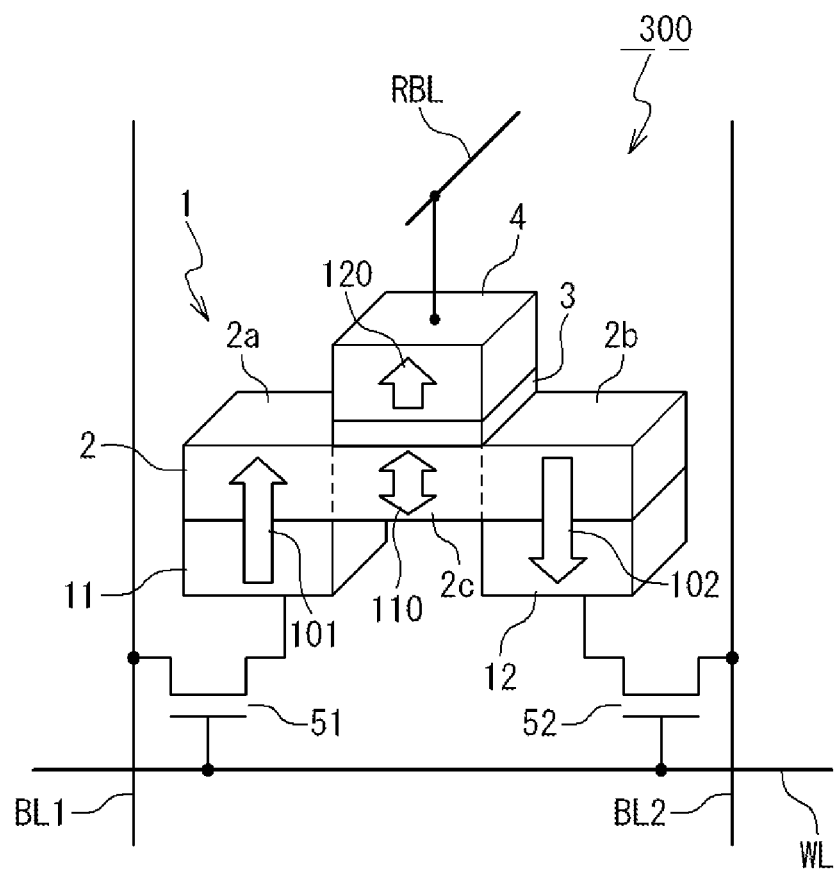
FIG. 1B shows another exemplary structure of a memory cell of a known magnetic random access memory.
Figure 2A:
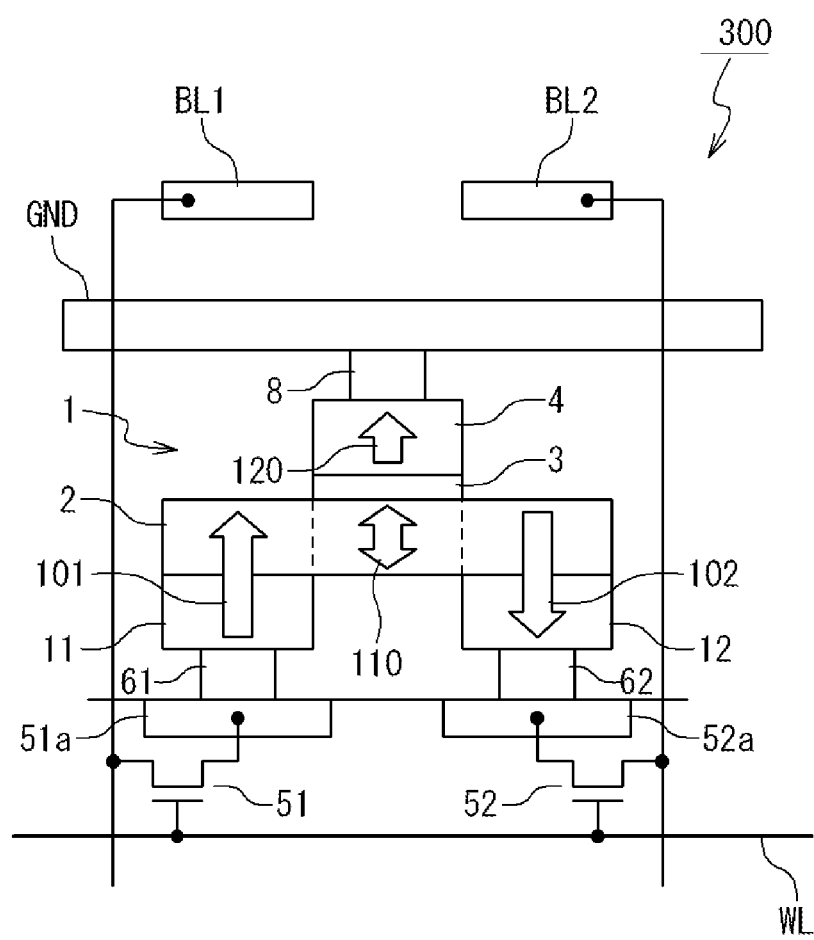
FIG. 2A is a cross section view showing the structure of the memory cell shown in FIG. 1A.
Figure 2B:
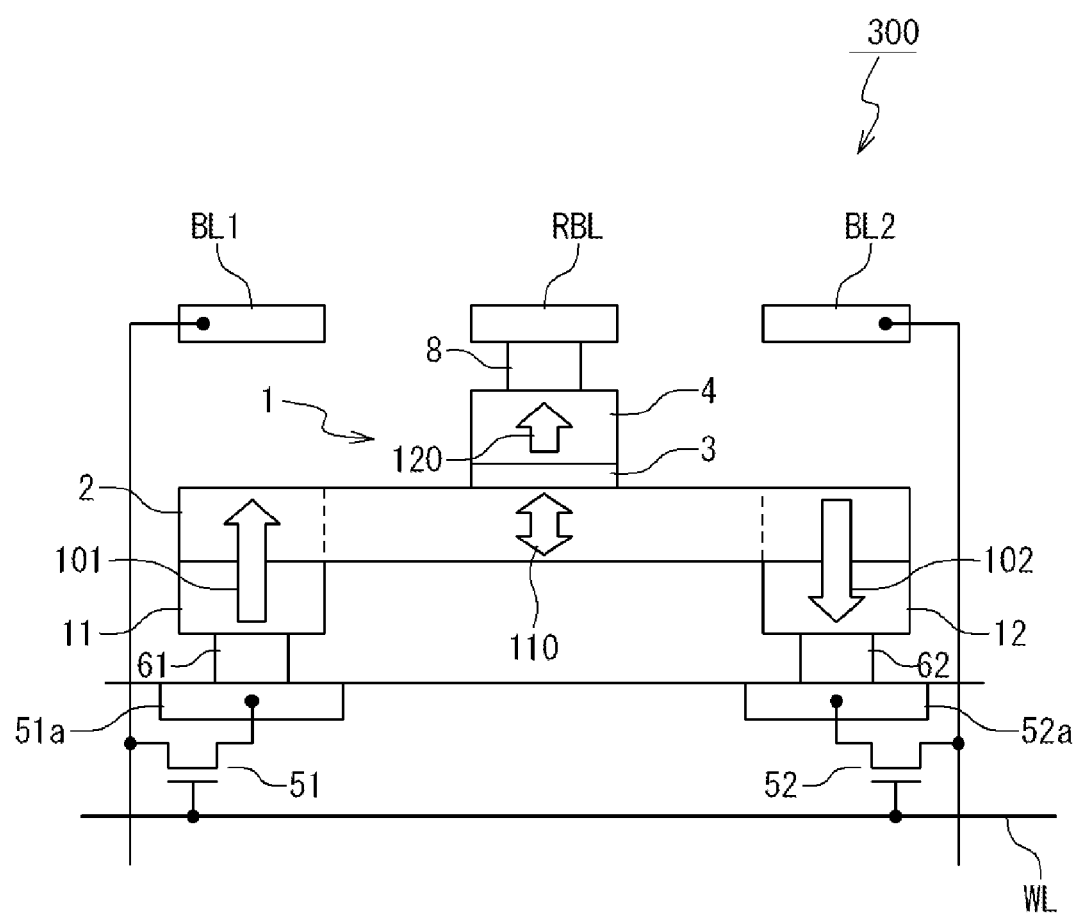
FIG. 2B is a cross section view showing the structure of the memory cell shown in FIG. 1B.
Figure 3A:
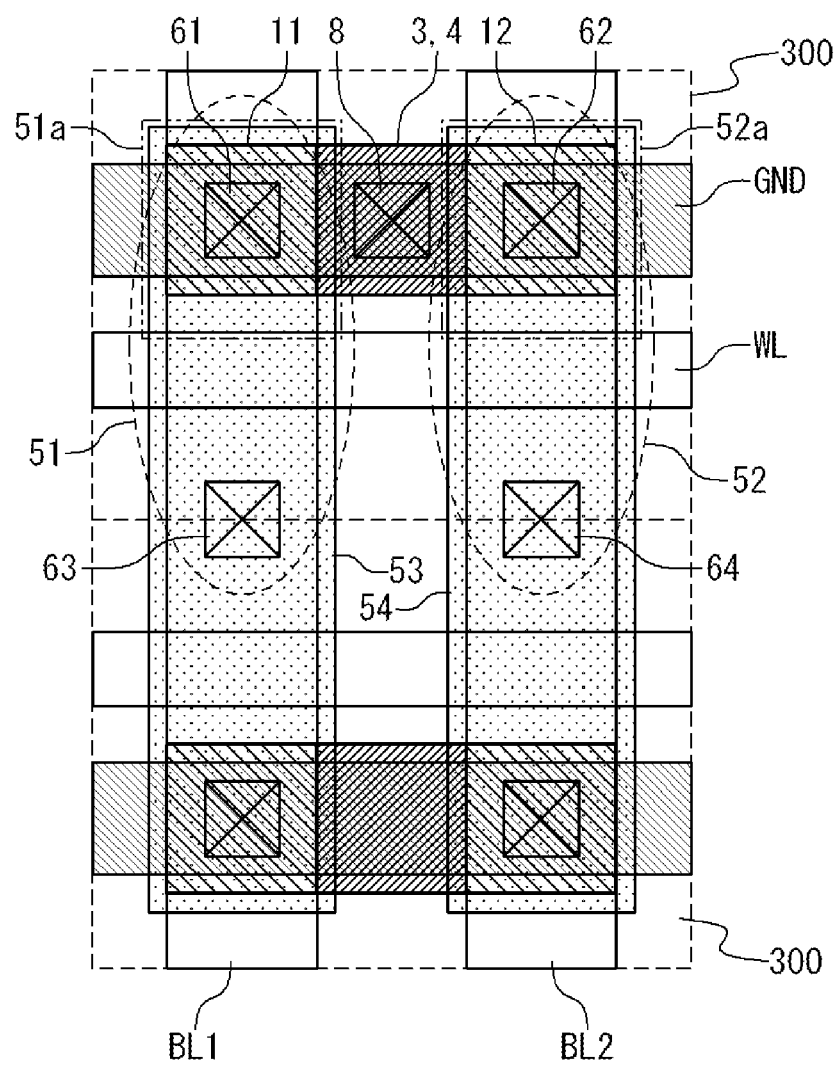
FIG. 3A is a plan view showing the layout of the memory cell shown in FIG. 1A.
Figure 3B:
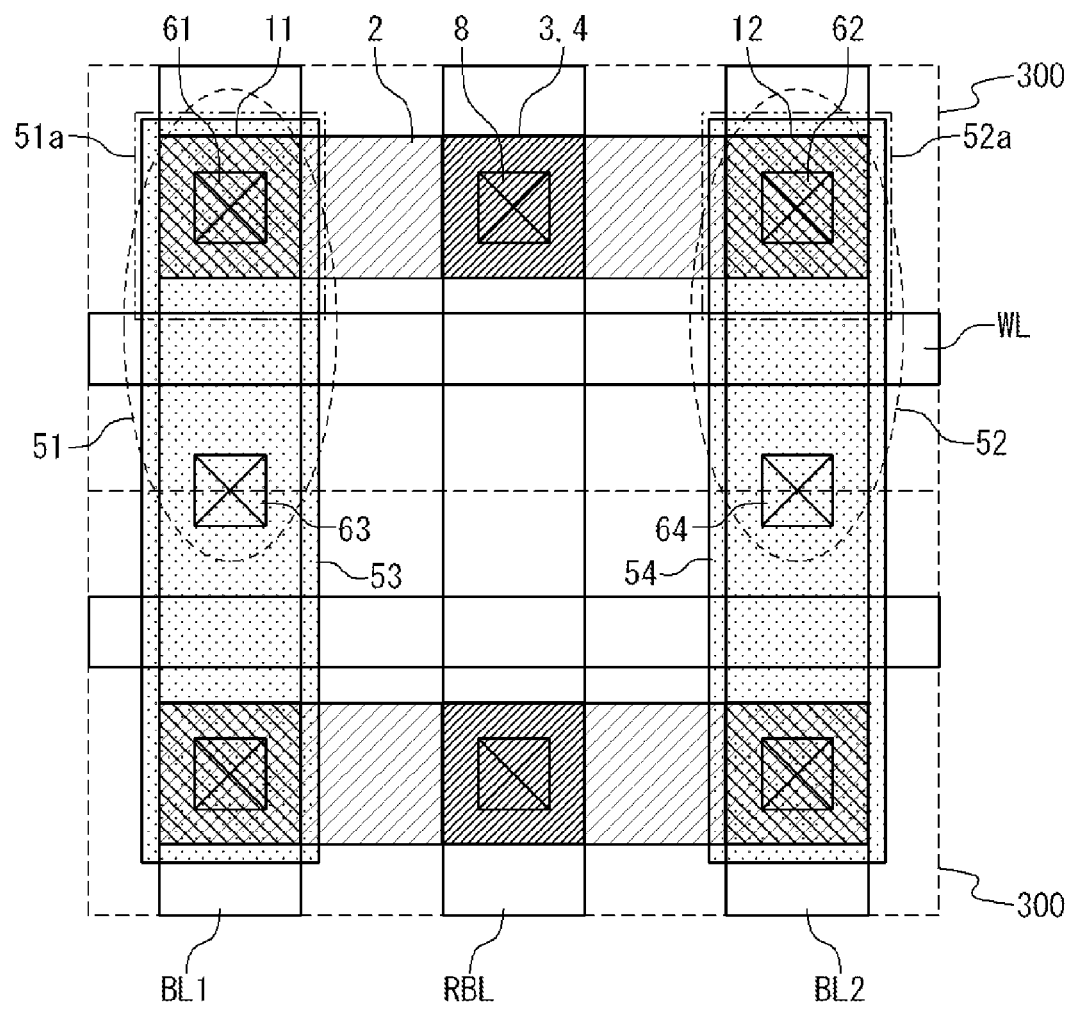
FIG. 3B is a plan view showing the layout of the memory cell shown in FIG. 1B.
Figure 4:
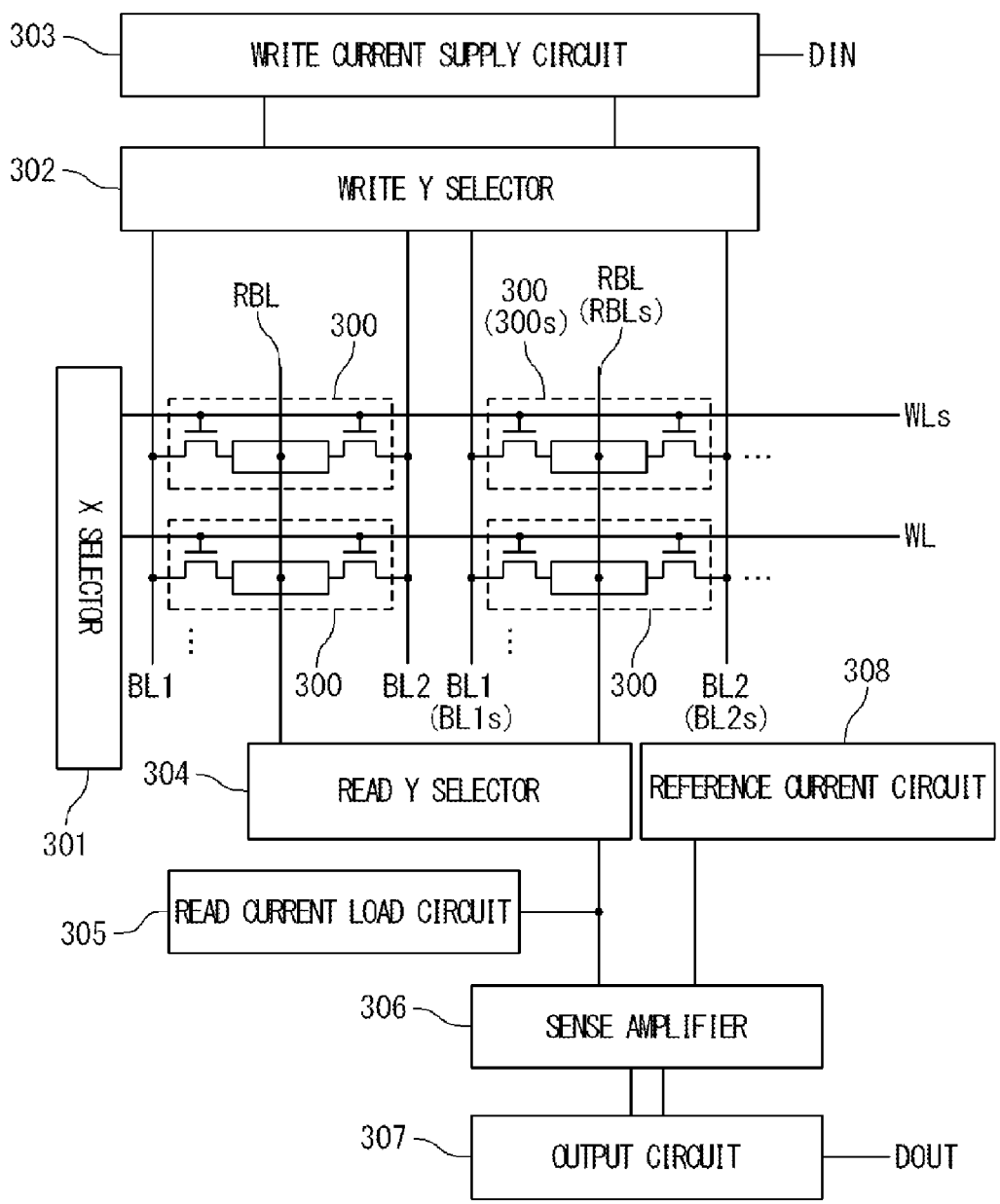
FIG. 4 is a block diagram showing an example of the configuration of a magnetic random access memory which incorporates memory cells shown in FIGS. 1B to 3B.

In the MRAM shown in FIG. 4, the differentia currents ΔL and ΔH are about 0.22 times the read current $i_H$ as indicated by expressions (7) and (8). In this embodiment, on the other hand, a differential current of 0.44 times the read current $i_H$ can be obtained as is understood from expression (10) and the read margin is effectively enlarged. The same goes for the case when "1" data are read.

An additional advantage is that the effect of the on-resistance of the NMOS transistors 51 and 52 is made negligible, since each of the two MTJs used for the data reading is connected to the drains of the NMOS transistors 51 and 52. In the MRAM structure shown in FIG. 4, in which the reference current is generated from a pair of reference cells, the variability in the on-resistance of the MOS transistors used for the memory cell selection undesirably reduces the read margin. The MRAM of this embodiment, in which the effect of the on-resistance of the MOS transistors used for the memory cell selection can be neglected, can make effective use of the MR ratio, and enlarge the read margin.

Although the magnetization directions of the magnetization fixed layers 11, 12, the magnetic recording layer 2 and the reference layers 41 and 42 are all described as being directed in the directions perpendicular to the film surfaces, the magnetization directions of these layers may be directed in the in-plane directions instead. Also in this case, the magnetic random access memory of this embodiment can operate in the same way.

Second Embodiment

Figure 11:
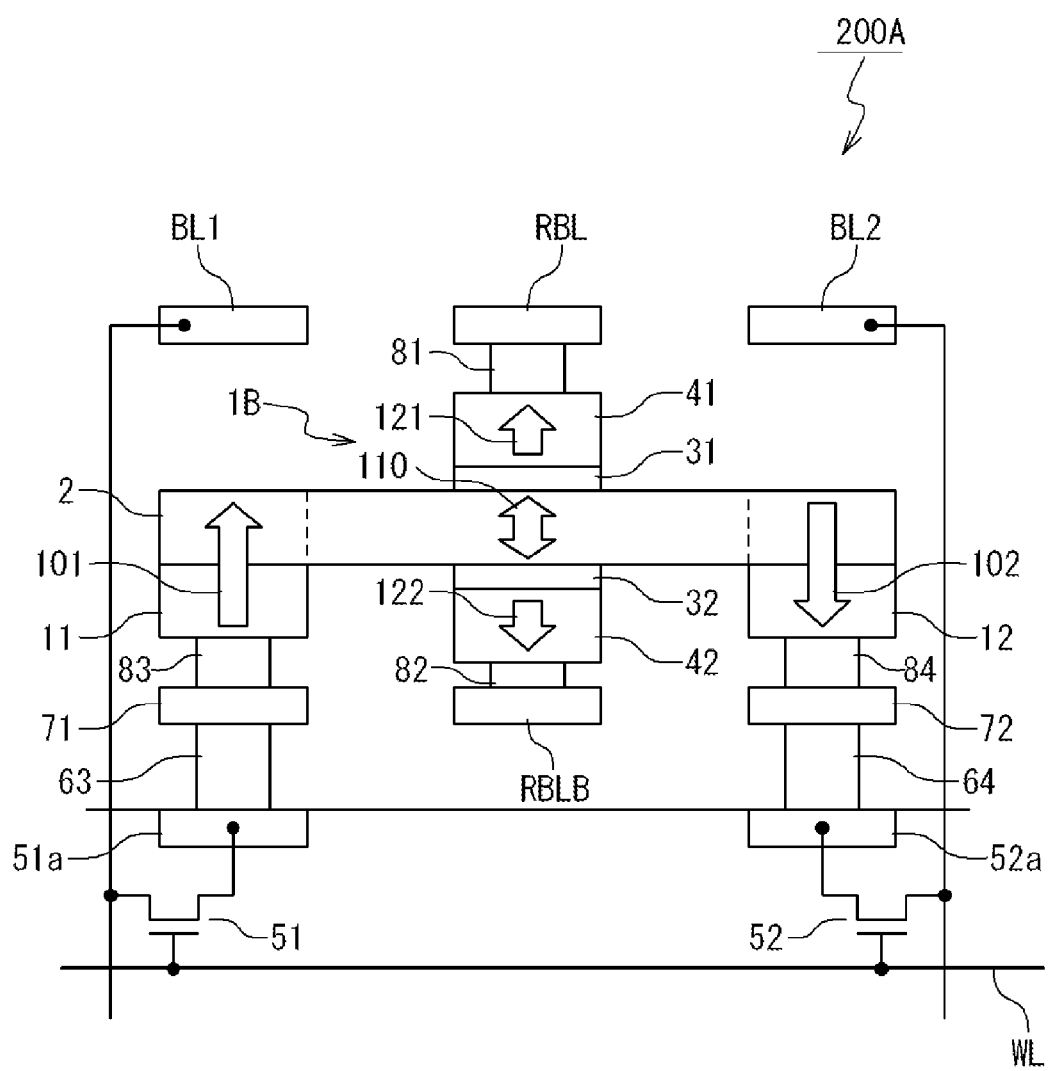
FIG. 11 is a cross section view showing an exemplary structure of a memory cell of a magnetic random access memory of a second embodiment.

FIG. 11 is a cross section view showing an exemplary structure of a memory cell 200A of a magnetic random access memory of a second embodiment. In the second embodiment, the reference layer 42 is positioned opposed to the reference layer 41 across the magnetic recording layer 2 and disposed on the same surface of the magnetic recording layer 2 as the magnetization fixed layers 11 and 12. The tunnel barrier film 32 is disposed between the reference layer 42 and the magnetic recording layer 2. The magnetization direction of the reference layer 42 (indicated by the arrow 122) is directed in the opposite direction to the magnetization direction of the reference layer 41. The reference layer 42 is connected to the read bitline RBLB via a via-contact 82. The read bitline RBLB is positioned under the magnetic recording layer 2.

The magnetization fixed layer 11 is connected to a metal interconnection 71 via a via-contact 83 and the metal interconnection 71 is connected to the drain 51a of the NMOS transistor 51 via a via-contact 63.

The magnetization fixed layer 12 is connected to a metal interconnection 72 via a via-contact 84 and the metal interconnection 72 is connected to the drain 52a of the NMOS transistor 52 via a via-contact 64. FIG. 11 shows the NMOS transistors 51 and 52 only schematically, because the diffusion layers of the NMOS transistors 51 and 52 are actually formed to extend in parallel to the write bitlines BL1 and BL2. The magnetoresistance effect element 1B is formed between the first interconnection layer (that is, the lowermost metal interconnection layer) in which the metal interconnections 71, 72 and the read bitline RBLB are positioned, and the second interconnection layer (that is, the second lowermost metal interconnection layer) in which the write bitlines BL1, BL2 and the read bitline RBLT.

Figure 12:
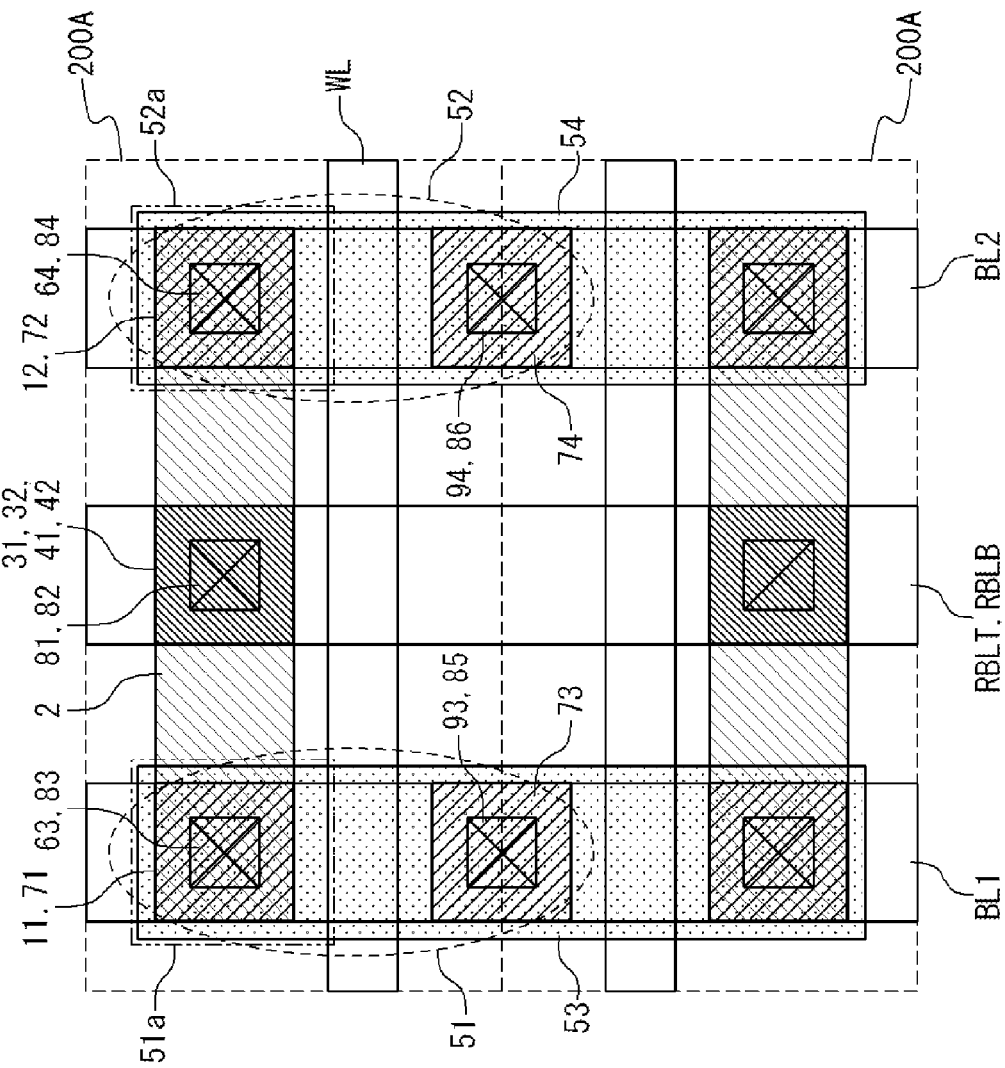
FIG. 12 is a plan view showing the layout of the memory cell of the second embodiment.

FIG. 12 is a plan view showing the layout of MRAM cells in the second embodiment. As shown in FIG. 12, two memory cells 200A are mirror-symmetrically arranged.

The write bitlines BL1 and BL2 and the read bitline RBLT, which are positioned in the second interconnection layer, are arranged in parallel in accordance with the design rules. In each memory cell 200A, the diffusion layers 53, 54 and the word line WL, which are disposed to intersect with the diffusion layers 53 and 54, form the NMOS transistors 51 and 52, and the word line WL is disposed to extend in the perpendicular direction to the write bitlines BL1 and BL2. The drain of the NMOS transistor 51 is connected to the magnetization fixed layer 11 via the via-contact 63, the metal interconnection 71 and the via-contact 83, and the drain of the NMOS transistor 52 is connected to the magnetization fixed layer 12 via the via-contact 64, the metal interconnection 72 and the via-contact 84. The source of the NMOS transistor 51, on the other hand, is connected to a metal interconnection 73 via a via-contact 93 and the metal interconnection 73 is connected to the write bitline BL1 via a via-contact 85. Furthermore, the source of the NMOS transistor 52 is connected to a metal interconnection 74 via a via-contact 94 and the metal interconnection 74 is connected to the write bitline BL2 via a via-contact 86. It should be noted that the metal interconnections 73 and 74 are disposed in the first interconnection layer. The magnetic recording layer 2 is disposed at certain distances from the memory cell boundary and the via-contacts 93 and 94, in accordance with the design rules. The tunnel barrier film 31 is disposed on the upper face of the magnetic recording layer 2 and the reference layer 41 is disposed on the upper face of the tunnel barrier film 31. The reference layer 41 is connected to the read bitline RBLT via the via-contact 81. The read bitline RBLB positioned in the first interconnection layer is arranged at the same coordinates as the read bitline RBLT positioned in the second interconnection layer. The tunnel barrier film 32 is disposed on the bottom face of the magnetic recording layer 2 and the reference layer 42 is disposed on the bottom face of the tunnel barrier film 32. The reference layer 42 is connected to the read bitline RBLB via the via-contact 82.

The magnetic random access memory of the second embodiment operates in the same way as that of the first embodiment, and effectively enlarges the read margin as is the case with the first embodiment. Additionally, the MRAM structure of the second embodiment, in which the reference layer 41 overlaps the reference layer 42, allows reducing the distance between the magnetization fixed layers 11 and 12 compared to the first embodiment, and thereby effectively reduces the area of the memory cell. Also, the MRAM structure of the second embodiment effectively avoids occurrence of the state in which data stored in the memory cell 200A is indefinite; in the first embodiment, data stored in the memory cell 200 may be indefinite when the magnetic domain wall is positioned between the reference layers 41 and 42. This advantageously improves the operation reliability. Furthermore, the MRAM structure of the second embodiment advantageously shortens the write time due to the short moving distance of the magnetic domain wall.

Third Embodiment

Figure 13:
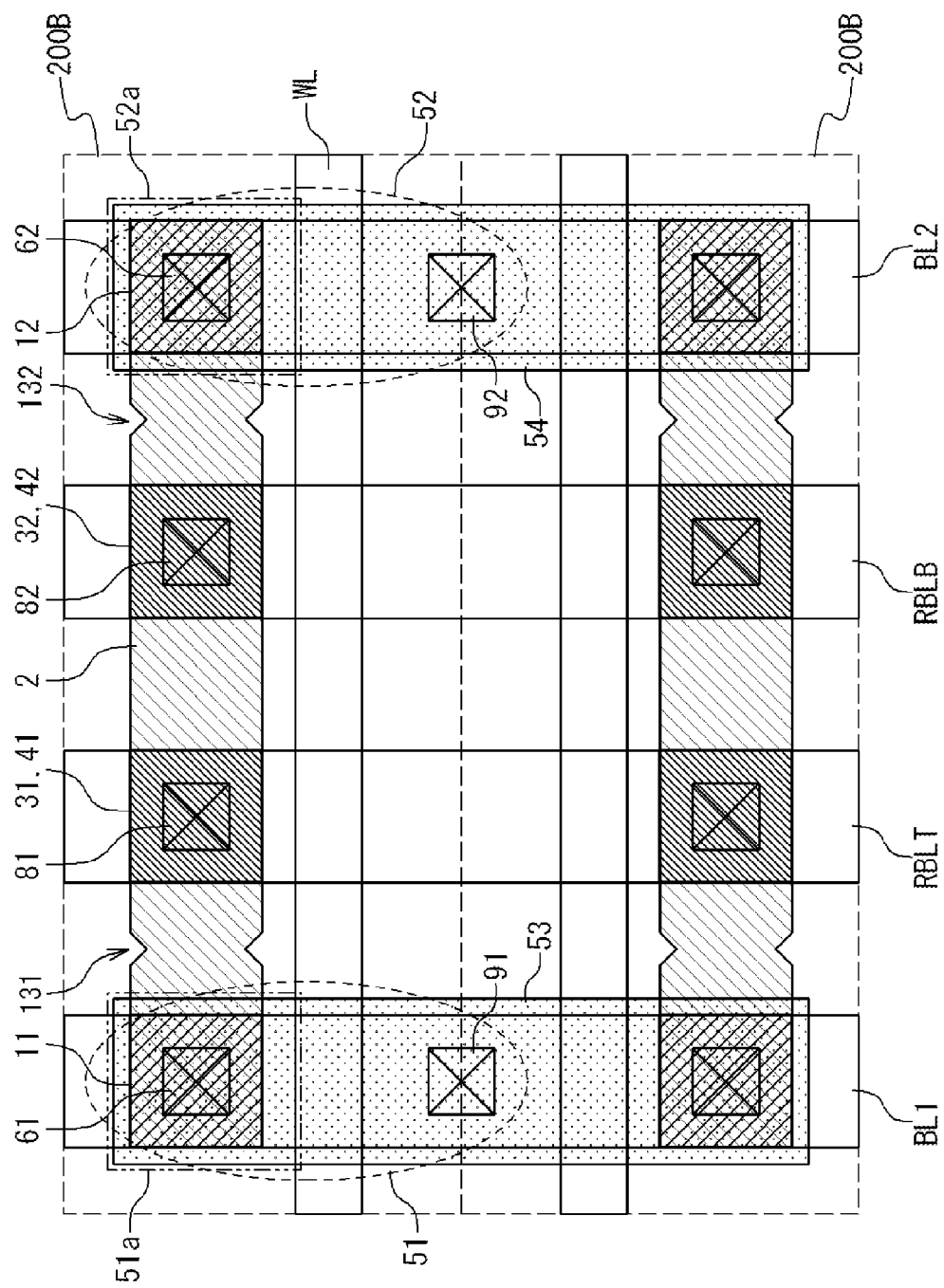
FIG. 13 is a plan view showing an exemplary layout of a memory cell of a third embodiment.

FIG. 13 is a layout diagram showing the layout of memory cells 200B of a magnetic random access memory of a third embodiment. In the third embodiment, notches 131 and 132 are provided for the magnetic recording layer 2. The notches 131 are positioned between the magnetization fixed layer 11 and the reference layer 41 and the notches 132 are positioned between the reference layer 42 and the magnetization fixed layer 12. The notches 131 and 132 function as pin potentials for the magnetic domain wall. Accordingly, the notches 131 and 132 make it easy to control the position of the magnetic domain wall in the magnetic recording layer 2, effectively improving the reliability of the data writing.

Fourth Embodiment

FIG. 14 is a layout diagram showing an exemplary layout of memory cells 200C of an MRAM of a fourth embodiment. In the layout of the fourth embodiment shown in FIG. 14, the width W of the diffusion layers 53 and 54 are increased, compared to the layout shown in FIG. 7. More specifically, the diffusion layer 53 is disposed so as to at least reach the region under the read bitline RBLT from the via-contact 91 which connects the write bitline BL1 and the diffusion layer 53, and the diffusion layer 54 is disposed so as to at least reach the region under the read bitline RBLB from the via-contact 92 which connects the write bitline BL2 and the diffusion layer 54. In the layout shown in FIG. 14, the diffusion layers 53 and 54 are disposed to reach the region between the read bitlines RBLB and RBLT.

The increase in the channel widths (gate widths) of the NMOS transistors 51 and 52 enables flowing a large write current, and effectively reduces the length of time necessary for completing the data write. In order to generate a large write current, it is preferable that the spacing between the diffusion layers 53 and 54 is adjusted to the minimum dimension allowed in the design rules used for manufacturing the MRAM. This allows maximizing the channel widths of the NMOS transistors 51 and 52.

Although various embodiments are described above, the present invention should not be interpreted as being limited to the above-describe embodiments. The present invention may be implemented with various modifications which are obvious to the person skilled in the art. It should be also noted that two or more of the above-described embodiments may be combined if there is no technical inconsistency. For example, the layouts of the magnetic random access memories of the third and fourth embodiments are applicable to the magnetic random access memories of other embodiments.

What is claimed is:
1. A semiconductor device, comprising:
a memory cell including:
   a magnetic recording layer formed of ferromagnetic material;
   first and second magnetization fixed layers coupled to said magnetic recording layer;
   first and second reference layers opposed to said magnetic recording layer; and
   first and second tunnel barrier films inserted between said magnetic recording layer and said first and second reference layers, respectively,
wherein said first magnetization fixed layer has a magnetization fixed in a first direction,
wherein said second magnetization fixed layer has a magnetization fixed in a second direction opposite to said first direction,
wherein said first and second reference layers and said first and second tunnel barrier films are positioned between said first and second magnetization fixed layers,
wherein said first reference layer has a magnetization fixed in a third direction which is selected from said first and second directions, and
wherein said second reference layer has a magnetization fixed in a fourth direction opposite to said third direction.

2. The semiconductor device according to claim 1, further comprising:
a read circuit configured to generate a first read current flowing through a first MTJ which incorporates said first reference layer, said first tunnel barrier film and said magnetic recording layer and to generate a second current flowing through a second MTJ which incorporates said second reference layer, said second tunnel barrier film and said magnetic recording layer,
wherein said read circuit identifies data stored in said memory cell by comparing said first and second read currents.

3. The semiconductor device according to claim 1, wherein said first reference layer is disposed opposed to a first face of said magnetic recording layer, and wherein said second reference layer is disposed opposed to a second face of said magnetic recording layer, said second face being opposite to said first face.

4. The semiconductor device according to claim 1, further comprising:
a write circuit configured to generate a write current flowing between said first and second magnetization fixed layers,
wherein said first reference layer is disposed adjacent to said first magnetization fixed layer,
wherein said second reference layer is disposed adjacent to said second magnetization fixed layer, and
wherein data writing into said memory cell is achieved by moving a magnetic domain wall of said magnetic recording layer to a position between said first reference layer and said first magnetization fixed layer or to a position between said second reference layer and said second magnetization fixed layer, with said write current.

5. The semiconductor device according to claim 1, further comprising:
first and second write bitlines; and
first and second read bitlines connected to said first and second reference layers, respectively, and disposed in parallel to said first and second write bitlines between said first and second write bitlines,
wherein said memory cell further includes:
a first MOS transistor having a drain connected to said first magnetization fixed layer and a source connected to said first write bitline; and
a second MOS transistor having a drain connected to said second magnetization fixed layer and a source connected to said second write bitline,
wherein a first diffusion layer and a word line disposed to intersect said first diffusion layer form said first MOS transistor, and
wherein said first diffusion layer is disposed to at least reach a region under said first read bitline from a via-contact which connects the source of said first MOS transistor and said first write bit line.

6. The semiconductor device according to claim 5, wherein a second diffusion layer and said word line form said second MOS transistor,
wherein said word line is disposed to intersect said second diffusion layer,
wherein said second diffusion layer is disposed to at least reach a region under said second read bitline from a via-contact which connects the source of said second MOS transistor and said second write bit line.

7. The semiconductor device according to claim 1, wherein said magnetic recording layer has a first notch positioned between said first reference layer and said first magnetization fixed layer and a second notch positioned between said second reference layer and said second magnetization fixed layers.

8. A magnetic random access memory, comprising:
a memory cell including:
a magnetic recording layer formed of ferromagnetic material;
first and second magnetization fixed layers coupled to said magnetic recording layer;
first and second reference layers opposed to said magnetic recording layer; and
first and second tunnel barrier films inserted between said magnetic recording layer and said first and second reference layers, respectively,
wherein said first magnetization fixed layer has a magnetization fixed in a first direction,
wherein said second magnetization fixed layer has a magnetization fixed in a second direction opposite to said first direction,
wherein said first and second reference layers and said first and second tunnel barrier films are positioned between said first and second magnetization fixed layers,
wherein said first reference layer has a magnetization fixed in a third direction which is selected from said first and second directions, and
wherein said second reference layer has a magnetization fixed in a fourth direction opposite to said third direction.

* * * * *

UNITED STATES PATENT AND TRADEMARK OFFICE
CERTIFICATE OF CORRECTION

PATENT NO. : 8,971,101 B2
APPLICATION NO. : 13/558583
DATED : March 3, 2015
INVENTOR(S) : Masaru Matsui Page 1 of 1

It is certified that error appears in the above-identified patent and that said Letters Patent is hereby corrected as shown below:

IN THE SPECIFICATION

Column 9, Line 55: Delete "$\Delta RBL = i_{RBLB} - i_{RBKT}$," and insert -- $\Delta RBL = i_{RBLB} - i_{RBLT}$, --

Signed and Sealed this
First Day of December, 2015

Michelle K. Lee
*Director of the United States Patent and Trademark Office*